United States Patent
Ibe et al.

(10) Patent No.: US 8,319,212 B2
(45) Date of Patent: Nov. 27, 2012

(54) LIGHT-EMITTING DEVICE AND ELECTRONIC DEVICE

(75) Inventors: Takahiro Ibe, Atsugi (JP); Hisao Ikeda, Isehara (JP); Junichi Koezuka, Isehara (JP); Kaoru Kato, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/948,198

(22) Filed: Nov. 17, 2010

(65) Prior Publication Data
US 2011/0057183 A1    Mar. 10, 2011

Related U.S. Application Data

(62) Division of application No. 12/213,094, filed on Jun. 13, 2008, now Pat. No. 7,838,874.

(30) Foreign Application Priority Data

Jun. 14, 2007    (JP) ................................ 2007-157434

(51) Int. Cl.
*H01L 51/54* (2006.01)
(52) U.S. Cl. ................. 257/40; 257/E51.019
(58) Field of Classification Search .............. 257/40, 257/59, E51.019, E51.024
See application file for complete search history.

(56) References Cited

U.S. PATENT DOCUMENTS

| | | | |
|---|---|---|---|
| 5,989,737 A | 11/1999 | Xie et al. | |
| 6,013,384 A | 1/2000 | Kido et al. | |
| 6,423,429 B2 | 7/2002 | Kido et al. | |
| 6,432,561 B1 | 8/2002 | Yamazaki | |
| 6,486,601 B1 | 11/2002 | Sakai et al. | |
| 6,589,673 B1 | 7/2003 | Kido et al. | |
| 6,620,528 B1 | 9/2003 | Yamazaki et al. | |
| 6,673,643 B2 | 1/2004 | Yamazaki | |
| 7,141,817 B2 | 11/2006 | Nishi et al. | |
| 7,158,161 B2 | 1/2007 | Gyoutoku et al. | |
| 7,205,019 B2 | 4/2007 | Yamazaki et al. | |
| 7,456,037 B2 | 11/2008 | Yamazaki | |
| 7,785,718 B2 | 8/2010 | Yatsunami et al. | |
| 7,839,078 B2 | 11/2010 | Nishita et al. | |
| 2003/0189401 A1* | 10/2003 | Kido et al. ................. | 313/504 |

(Continued)

FOREIGN PATENT DOCUMENTS

EP    0 855 848    7/1998

(Continued)

*Primary Examiner* — Thomas L Dickey
(74) *Attorney, Agent, or Firm* — Eric J. Robinson; Robinson Intellectual Property Law Office, P.C.

(57) ABSTRACT

The present invention provides a light-emitting element and a light-emitting device which have high contrast, and specifically, provides a light-emitting device whose contrast is enhanced, not by using a polarizing plate but using a conventional electrode material. Reflection of external light is suppressed by provision of a light-absorbing layer included between a non-light-transmitting electrode and a light-emitting layer. As the light-absorbing layer, a layer is used, which is obtained by adding a halogen atom into a layer including an organic compound and a metal oxide. Further, the light-absorbing layer is formed also over a region in which a thin film transistor for driving a light-emitting element is formed, a region in which a wiring is formed, and the like, and thus light is extracted from the side opposite to the region in which the TFT is formed, thereby reducing reflection of external light.

23 Claims, 7 Drawing Sheets

U.S. PATENT DOCUMENTS

| | | |
|---|---|---|
| 2005/0084712 A1 | 4/2005 | Kido et al. |
| 2005/0084713 A1 | 4/2005 | Kido et al. |
| 2005/0098207 A1 | 5/2005 | Matsumoto et al. |
| 2006/0292394 A1* | 12/2006 | Iwaki et al. .................. 428/690 |
| 2009/0167158 A1 | 7/2009 | Kathirgamanathan et al. |

FOREIGN PATENT DOCUMENTS

| | | |
|---|---|---|
| EP | 0 948 063 | 10/1999 |
| EP | 1 009 198 | 6/2000 |
| EP | 1071144 A | 1/2001 |
| EP | 1071145 A | 1/2001 |
| EP | 1 089 361 | 4/2001 |
| EP | 1 351 558 | 10/2003 |
| EP | 1 524 706 | 4/2005 |
| EP | 1 524 707 | 4/2005 |
| EP | 1 530 245 | 5/2005 |
| JP | 03-274695 | 12/1991 |
| JP | 09-063771 | 3/1997 |
| JP | 11-307259 | 11/1999 |
| JP | 11-307264 | 11/1999 |
| JP | 2000-223276 | 8/2000 |
| JP | 2000-315580 | 11/2000 |
| JP | 2000-315581 | 11/2000 |
| JP | 2001-035657 A | 2/2001 |
| JP | 2001-102176 A | 4/2001 |
| JP | 2002-319488 A | 10/2002 |
| JP | 2002-367784 | 12/2002 |
| JP | 2002-367785 A | 12/2002 |
| JP | 2004-349007 | 12/2004 |
| JP | 2005-019074 | 1/2005 |
| JP | 2005-026121 | 1/2005 |
| JP | 2005-032618 | 2/2005 |
| JP | 2005-310473 A | 11/2005 |
| JP | 2006-324537 A | 11/2006 |
| JP | 2007-110102 A | 4/2007 |
| JP | 2009-515331 | 4/2009 |
| WO | WO 2005/006460 | 1/2005 |
| WO | WO 2005/060017 | 6/2005 |
| WO | WO-2007/052083 | 5/2007 |

* cited by examiner

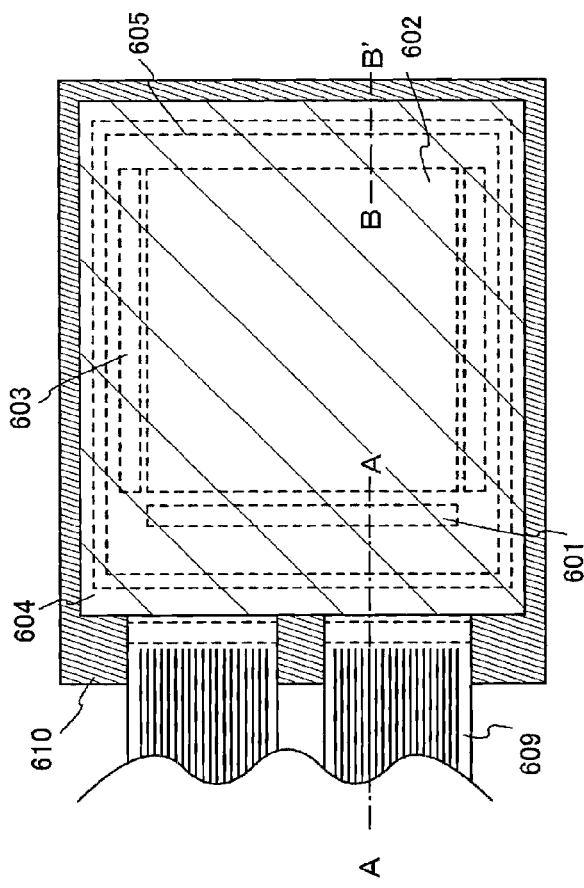
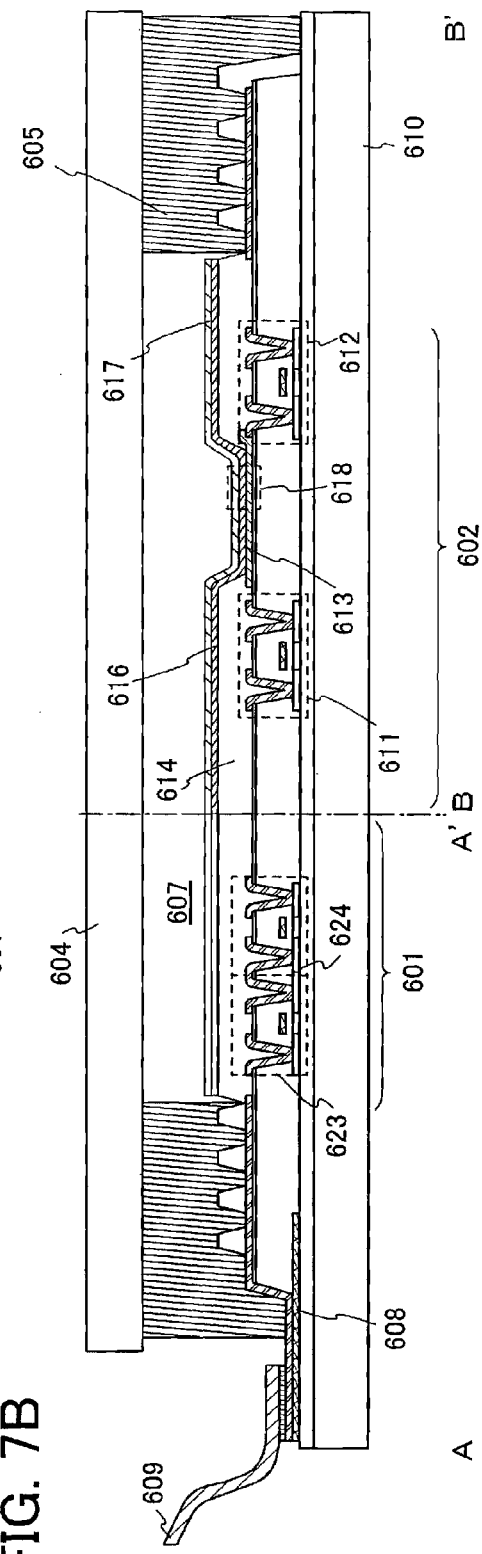
FIG. 7A
FIG. 7B

LIGHT-EMITTING DEVICE AND ELECTRONIC DEVICE

BACKGROUND OF THE INVENTION

1. Field of the Invention

The present invention relates to a light-emitting element and a light-emitting device utilizing light emission such as electroluminescence, and a manufacturing method thereof. Further, the present invention relates to an electronic device having a light-emitting device.

2. Description of the Related Art

A display device including a light-emitting element (hereinafter, referred to as a light-emitting device) has advantages such as wide viewing angle, low power consumption, and high response speed as compared with a liquid crystal display device, and research and development thereof have been actively carried out.

The light-emitting element has a light-emitting substance provided between a pair of electrodes, and light from the light-emitting substance is extracted depending on the light-transmitting property of the electrodes.

For example, in a case where light is desired to be extracted in one direction, a structure can be given such that one electrode provided for the one direction is a light-transmitting electrode, while the other electrode is a non-light-transmitting electrode, i.e., a reflective electrode.

If such a reflective electrode is used, reflection of external light is problematic. In order to prevent reflection of external light, there is proposed a structure in which a polarizing plate or a circular polarizing plate is provided. However, when a polarizing plate is used, loss of light from a light-emitting element is concerned and a step of attaching the polarizing plate is needed, which leads to increase of a manufacturing cost.

In view of the above, there is proposed a method of using a material having a light-absorbing property for a non-light-transmitting electrode as a method for preventing reflection of external light (Reference 1: Japanese Published Patent Application No. 2005-19074).

SUMMARY OF THE INVENTION

Reference 1 discloses that a combination of a metal thin film having a light-transmitting property, such as calcium or lithium, and titanium oxide having a function of an anti-reflection film is used a non-light-transmitting electrode which absorbs external light.

In this method, in a case where the metal thin film is thick enough to have electrical conductivity necessary for an electrode of a light-emitting device, it is considered that light reflection is generated by the metal thin film. Thus, it is concerned that part of external light is reflected, which may lead to contrast reduction.

In addition, when reflection of external light is particularly desired to be suppressed, there is a concern that the kinds of metals which can be used as electrode materials may be limited.

In view of the above problems, it is an object of the present invention to provide a light-emitting element and a light-emitting device which have high contrast. More specifically, it is an object of the present invention to provide a light-emitting device whose contrast is enhanced, not by using a polarizing plate but using a conventional electrode material.

In view of the above objects, one feature of the present invention is that reflection of external light is suppressed by provision of a light-absorbing layer included between a non-light-transmitting electrode and a light-emitting layer. As the light-absorbing layer, a layer is used, which is obtained by adding a halogen atom into a layer including an organic compound and a metal oxide.

A specific feature of the present invention is a light-emitting element which includes a first electrode, a second electrode opposite to the first electrode, and a light-emitting layer formed between the first electrode and the second electrode, wherein a light-absorbing layer including a metal oxide, an organic compound and a halogen atom is formed between the first electrode and the second electrode to absorb incident light from an external portion.

In the above structure, the light-absorbing layer is arranged between a non-light-transmitting electrode and the light-emitting layer. The light-absorbing layer absorbs light in the visible region and functions as a charge-injecting layer, in accordance with the dose amount of halogen atom.

Further, the present invention has a feature of reducing reflection of external light in a region other than the light-emitting element portion. In other words, a light-absorbing layer is formed also over a region in which a thin film transistor for driving a light-emitting element is formed (hereinafter, referred to as a TFT portion), a region in which a wiring is formed (hereinafter, a wiring portion), or the like, and thus light is extracted from the side opposite to the TFT portion side, thereby reducing reflection of external light.

According to the present invention, a light-emitting element in which reflection of external light is suppressed and a light-emitting device having the light-emitting element can be provided. In other words, a light-emitting device in which contrast reduction due to reflection of external light is prevented can be provided.

Moreover, according to the present invention, a light-emitting device can be provided, which does not need a polarizing plate or the like used as a means for preventing contrast reduction due to reflection of external light. As a result, light emission from a light-emitting element is not attenuated by a polarizing plate or the like. In addition, such polarizing plates and the like are expensive, but the present invention does not need a member such as a polarizing plate, and thus reduces a manufacturing cost. Further, such polarizing plates or the like are easy to be damaged, but this problem has no impact on the present invention.

Moreover, according to the present invention, external light is absorbed by a light-absorbing layer, and thus a material for a non-light-transmitting electrode may be any material, without being limited to a particular material. Therefore, a light-emitting device can be provided, in which a highly conductive metal or a low-cost metal is used as an electrode, without considering its reflectivity.

According to the present invention, a layer obtained by doping a layer in which an organic compound and a metal oxide are mixed, with a halogen atom is used as a light-absorbing layer, so that a light-emitting device achieving low-voltage drive can be provided. Further, the light-emitting layer and the first electrode, or the light-emitting layer and the second electrode can be separated from each other by forming the light-absorbing layer thick; therefore, quenching of light emission can be prevented. Furthermore, the light-emitting element can be formed thick; therefore, short circuiting between electrodes can be prevented and mass productivity can be enhanced.

BRIEF DESCRIPTION OF THE DRAWINGS

In the accompanying drawings:

FIGS. 7A and 7B illustrate a light-emitting device according to an aspect of the present invention.

DETAILED DESCRIPTION OF THE INVENTION

Figure 1:
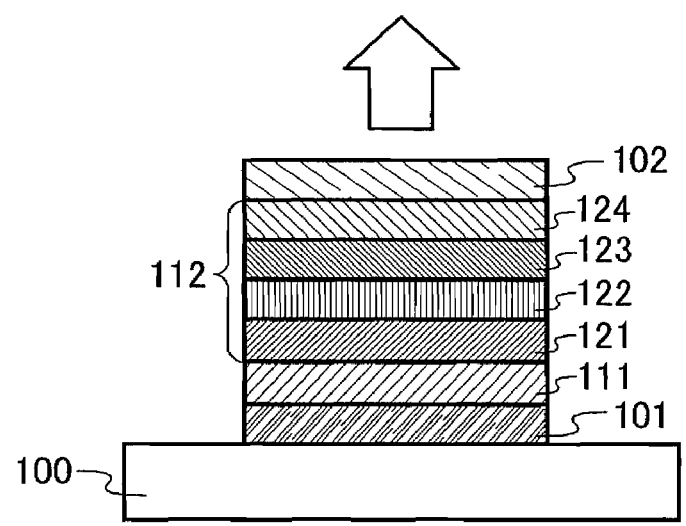
FIG. 1 illustrates a light-emitting element according to an aspect of the present invention.

Embodiment modes of the present invention are hereinafter described based on the drawings. However, it is easily understood by those who are skilled in the art that modes and details herein disclosed can be modified in various ways without departing from the spirit and the scope of the present invention. Therefore, the present invention is not construed as being limited to description of the embodiment modes. In the following description, like reference numerals are used to designate identical portions or portions having a similar function in different drawings for illustrating embodiment modes, and thus their repetitive description will be omitted.

Embodiment Mode 1

Embodiment Mode 1 will describe a light-emitting element having a structure in which reflection of light entering the light-emitting element from outside (external light) is suppressed.

FIG. 1 illustrates a light-emitting element in which a first electrode 101 formed over a substrate 100, a second electrode 102 opposite to the first electrode 101, a first layer 111 and a second layer 112. The first layer 111 and the second layer 112 are formed sequentially over the first electrode 101, and are between the first electrode 101 and the second electrode 102.

The substrate 100 is used as a support of the light-emitting element. For the substrate 100, glass, plastic, or the like can be used, for example. Any material other than these materials may be used as long as it functions as the support of the light-emitting element. In addition, the substrate 100 may include a structure of an interlayer insulating film or the like. If light is extracted to the outside through the substrate 100, the substrate 100 preferably has a light-transmitting property.

In description of this embodiment mode, it is assumed that the first electrode 101 functions as an anode and the second electrode 102 functions as a cathode. In other words, in the description below, it is assumed that light emission is obtained when voltage is applied to the first electrode 101 and the second electrode 102 such that the potential of the first electrode 101 is higher than that of the second electrode 102.

The first electrode 101 is preferably formed of a metal, alloy, electrically conductive compound, or mixture of these, each having a high work function (specifically, a work function of 4.0 eV or higher is preferable). Specifically, indium tin oxide (ITO), indium tin oxide containing silicon or silicon oxide, indium zinc oxide (IZO), indium tin oxide containing tungsten oxide and zinc oxide (IWZO), and the like can be used, for example. Films including these conductive metal oxides are generally formed by sputtering; however, a sol-gel method or the like may also be applied. For example, indium zinc oxide (IZO) can be formed by a sputtering method using a target in which zinc oxide of 1 wt % to 20 wt % is added to indium oxide. A film of indium oxide including tungsten oxide and zinc oxide (IWZO) can be formed by a sputtering method using a target in which tungsten oxide of 0.5 wt % to 5 wt % and zinc oxide of 0.1 wt % to 1 wt % are included in indium oxide. Besides, gold (Au), platinum (Pt), nickel (Ni), tungsten (W), chromium (Cr), molybdenum (Mo), iron (Fe), cobalt (Co), copper (Cu), palladium (Pd), nitrides of metal materials (for example, titanium nitride), and the like can be given.

When a layer including a composite material which is described later is used as a layer having a contact with the first electrode 101, the first electrode 101 can be formed using any of a variety of metals, alloys, electrically conductive compounds, a mixture of them, or the like regardless of their work functions. For example, aluminum (Al), silver (Ag), an alloy including aluminum (e.g., AlSi), or the like can be used. Alternatively, any of the following low work function materials can be used: Group 1 and Group 2 elements of the periodic table, that is, alkali metals such as lithium (Li) and cesium (Cs) and alkaline-earth metals such as magnesium (Mg), calcium (Ca), and strontium (Sr), and alloys thereof (MgAg or AlLi); rare earth metals such as europium (Eu) and ytterbium (Yb), and alloys thereof; and the like. A film made of an alkali metal, an alkaline earth metal, or an alloy of them can be formed by a vacuum evaporation method. Further, a film made of an alloy of an alkali metal or an alkaline earth metal can be formed by a sputtering method. It is also possible to deposit a silver paste or the like by a droplet-discharging method or the like.

As a substance used for the second electrode 102, a metal, an alloy, an electrically conductive compound, or a mixture thereof, or the like with a low work function (specifically, a work function of 3.8 eV or lower is preferable) can be used. Specific examples of such cathode materials include elements belonging to Group 1 and 2 of the periodic table, i.e., alkali metals such as lithium (Li) and cesium (Cs) and alkaline earth metals such as magnesium (Mg), calcium (Ca), and strontium (Sr); alloys of them (e.g., MgAg and AlLi); rare earth metals such as europium (Eu) and ytterbium (Yb), alloys of them; and the like. A film made of an alkali metal, an alkaline earth metal, or an alloy of them can be formed by a vacuum evaporation method. Further, a film made of an alloy of an alkali metal or an alkaline earth metal can be formed by a sputtering method. It is also possible to deposit a silver paste or the like by a droplet-discharging method or the like.

When an electron-injecting layer 124 is provided between the second electrode 102 and the electron-transporting layer 123, any of a variety of conductive materials such as Al, Ag, ITO, or indium tin oxide containing silicon or silicon oxide can be used for the second electrode 102 regardless of its work function. Such conductive materials can be deposited by a sputtering method, a droplet-discharging method, a spin coating method, or the like.

Note that light emitted from the light-emitting layer is extracted to the outside through the first electrode or the second electrode. Thus, the first electrode or the second electrode preferably has a light-emitting property. The light-emitting element illustrated in FIG. 1 has a structure in which light emitted from the light-emitting layer is extracted to the outside through the second electrode, and thus the first electrode 101 has a non-light-transmitting property and the second electrode 102 has a light-transmitting property. In addition, the electrode having a light-transmitting property can be formed using a light-transmitting material, and further by making a non-light-transmitting material thin enough to transmit light.

The second layer 112 is a layer including a light-emitting layer. Since the first layer 111 has a function of a light-absorbing layer, the first layer 111 can absorb external light which have entered through the second electrode 102 and external light reflected on the first electrode 101. In this case, the thickness and the dose amount are preferably determined such that the absorptance to an estimated intensity of external light is 50% or higher. As described above, according to the present invention, only light emission from the second layer 112 (only self-luminous component) can be obtained without being subjected to influence of reflection of external light.

In other words, according to the present invention, reflection of external light is suppressed by the light-absorbing layer, and thus an effect similar to the effect of a polarizing plate can be obtained. The light-emitting device of the present invention is preferable for a top emission type light-emitting device in which light is extracted through the second electrode 102 opposite to the first electrode 101.

In the present invention, a film having a sufficient absorptance should be formed as the first layer 111. However, generally, the film is thick. Thus, the present invention employs a film obtained by adding a halogen atom into a film in which an organic compound and a metal oxide are mixed.

As a metal oxide used for the first layer 111, oxides of transition metal can be given. In addition, an oxide of metals that belong to Group 4 to Group 8 of the periodic table can be given. Specifically, vanadium oxide, molybdenum oxide, niobium oxide, rhenium oxide, tungsten oxide, ruthenium oxide, titanium oxide, chromium oxide, zirconium oxide, hafnium oxide, tantalum oxide, and the like can given. Such oxides are preferable since they have high electron-accepting properties. Besides, indium oxide, zinc oxide, or tin oxide can also be used. In the case where the mixed film is formed by an evaporation method, molybdenum oxide is particularly preferable because it is stable even in atmospheric air, has a low hygroscopic property, and is easy to handle. In particular, it is preferable that molybdenum trioxide be used.

As the organic compound used for the first layer 111, a variety of types of compounds such as an aromatic amine compound, a carbazole derivative, aromatic hydrocarbon, and a high molecular compound (oligomer, dendrimer, polymer, or the like) can be used. As the organic compound used for the first layer 111, a substance having a hole mobility of $10^{-6}$ cm$^2$/Vs or higher (a hole-transporting material) is preferable. Note that any material can be used, as long as it has a higher hole-transporting property than an electron-transporting property, as well as the above materials. The organic compound which can be used for the first layer 111 will hereinafter be described specifically.

For example, as the aromatic amine compound which can be used for the first layer 111, N,N'-bis(4-methylphenyl)-N, N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{4-[N'-(3-methylphenyl)-N-phenylamino]phenyl}-N-phenylamino)biphenyl (abbreviation: DNTPD); 1,3,5-tris[N-(4-diphenylaminophenyl)-N-phenylamino]benzene (abbreviation: DPA3B); and the like can be given.

As carbazole derivatives which can be used for the first layer 111, specifically, 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like are given.

Moreover, as carbazole derivatives which can be used for the first layer 111, 4,4'-di(N-carbazolyl)biphenyl (abbreviation: CBP); 1,3,5-tris[4-(N-carbazolyl)phenyl]benzene (abbreviation: TCPB); 9-[4-(10-phenyl-9-anthryl)phenyl]-9H-carbazole (abbreviation: CzPA); 1,4-bis[4-(N-carbazolyl)phenyl]-2,3,5,6-tetraphenylbenzene; or the like can be used.

As aromatic hydrocarbon which can be used for the first layer 111, for example, 2-tert-butyl-9,10-di(2-naphthyl)anthracene (abbreviation: t-BuDNA); 2-tert-butyl-9,10-di(1-naphthyl)anthracene, 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 9,10-bis[2-(1-naphthyl)phenyl]-2-tert-butyl-anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like are given. Besides, pentacene, coronene, or the like can also be used. In particular, an aromatic hydrocarbon which has a mobility of $1 \times 10^{-6}$ cm$^2$/Vs or higher and which has 14 to 42 carbon atoms is more preferable.

The aromatic hydrocarbon which can be used for the first layer 111 may have a vinyl skeleton. As the aromatic hydrocarbon having a vinyl group, for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like are given.

The layer including an organic compound and a metal oxide, as described above, can be formed by an evaporation method. Specifically, a co-evaporation method can be used when a layer in which a plurality of compounds are mixed is formed. The co-evaporation method includes a co-evaporation method using resistance heating evaporation, a co-evaporation method using electron beam evaporation, and a co-evaporation method using resistance heating evaporation and electron beam evaporation. Further, the layer can be formed by combining the same kind of methods or different kinds of methods, for example, a formation method using resistance heating evaporation and sputtering, a formation method using electron beam evaporation and sputtering, and the like. In addition, the above described examples are given in consideration of forming a layer containing two kinds of materials; however, a layer containing three or more kinds of materials can also be formed by combining the same kind of methods or different kinds of methods. The above dry method is not a limiting example, and a wet method may be used for forming the above layer.

The thus formed layer including an organic compound and a metal oxide is doped with a halogen atom, so that conductivity and light absorptance can be given to the layer and thus the first layer 111 can have a function as a light-absorbing layer. The halogen atom added to the layer is fluorine, chlorine, iodine, bromine, or the like, in particular, fluorine or chlorine is preferable. A known doping method can be employed as the method for adding the halogen atom. For example, an ion implantation method can be used.

In accordance with the concentration of the halogen atom added, the absorptance of the first layer 111 is varied. Thus, the concentration of the halogen atom included in the first layer 111 is preferably $1 \times 10^{21}$ atoms/cm$^3$ or higher.

Since an organic compound and an inorganic compound are mixed in the first layer 111, crystallization of the organic compound included in the first layer 111 can be suppressed. Thus, conductivity is high and thus the first layer 111 can be formed thick, without causing an increase in resistance. Hence, even if there is a depression/projection due to dust, dirt, or the like over the substrate, the depression/projection gives almost no influences since the first layer 111 is formed thick. Therefore, a defect such as short-circuiting between the first electrode 101 and the second electrode 102 due to a depression/projection can be prevented. By increasing the thickness of the first layer 111, increase in driving voltage can be suppressed and further light absorptance can be enhanced. As a result of use of the first layer 111, a material for the first electrode can be selected, without depending on its work function. In other words, not only a material having a high work function but also a material having low work function can be used for the first electrode 101.

Generally, by increasing the thickness of a layer in a light-emitting element, the driving voltage is increased, which is not preferable; however, when a film in which an organic compound and a metal oxide are mixed is used, the driving voltage itself can be decreased and further the driving voltage is not increased even when the thickness of the film in which an organic compound and a metal oxide are mixed becomes large.

The film in which an organic compound and a metal oxide are mixed does not absorb light in the visible region so much; however, addition of a halogen atom increases the absorptance of the film and gives the film a function as a light-absorbing layer.

The second layer 112 should include a light-emitting layer; however, there is no particular limitation on a stacked structure of the second layer 112. A layer including a substance with a high electron-transporting property, a substance with a high hole-transporting property, a substance with a high electron-injecting property, a substance with a high hole-injecting property, a bipolar substance (a substance with high electron-transporting and hole-transporting properties), or the like may be as appropriate combined with the light-emitting layer. For example, a hole-injecting layer, a hole-transporting layer, a light-emitting layer, an electron-transporting layer, an electron-injecting layer and the like can be combined as appropriate. A specific material to form each layer will be given below. In addition, the first layer 111 has a high carrier density and a superior hole-injecting property, and thus a light-emitting element with low driving voltage can be obtained even when a hole-injecting layer is not provided.

The hole-injecting layer is a layer having a substance with a high hole-injecting property. As the substance with a high hole-injecting property, molybdenum oxide, vanadium oxide, ruthenium oxide, tungsten oxide, manganese oxide, or the like can be used. In addition, it is possible to use a phthalocyanine-based compound such as phthalocyanine (abbreviation: H$_2$Pc) or copper phthalocyanine (abbreviation: CuPc), a high molecule such as poly(3,4-ethylenedioxythiophene)/poly(styrenesufonic acid) (PEDOT/PSS), or the like to form the hole-injecting layer.

Alternatively, as the hole-injecting layer, a composite material of a substance with a high hole-transporting property containing an acceptor substance may be used. It is to be noted that, by using such a composite material in which an acceptor substance is mixed into a substance with a high hole-transporting property, a material for forming an electrode can be selected regardless of the work function. That is, not only a high-work function material, but also a low-work function material can be used for the first electrode 101. As the acceptor substance, 7,7,8,8-tetracyano-2,3,5,6-tetrafluoroquinodimethane (abbreviation: F$_4$-TCNQ), chloranil, and the like can be given. Furthermore, a transition metal oxide can be given. In addition, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because they have a high electron accepting property. Above all, molybdenum oxide is particularly preferable because it is stable even in atmospheric air, has a low hygroscopic property, and is easy to handle.

As the substance having high hole-transporting properties used for the composite material, any of various compounds such as an aromatic amine compound, a carbazole derivative, aromatic hydrocarbon, and a high-molecular compound (such as an oligomer, a dendrimer, or a polymer) can be used. A substance having a hole mobility of $10^{-6}$ cm$^2$/Vs or more is preferably used as substance having a high hole-transporting property used for the composite material. Note that any material can be used as long as it has a hole-transporting property higher than an electron-transporting property, as well as the above materials. Hereinafter, organic compounds which can be used for the composite material will be specifically listed.

For example, the following can be given as the aromatic amine compound which can be used for the composite material: N,N'-bis(4-methylphenyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{-[N'-(3-methylphenyl)-N'-phenylamino]phenyl}-N-phenylamino)biphenyl (abbreviation: DNTPD); 1,3,5-tris[N-(4-diphenylaminophenyl)-N-phenylamino]benzene (abbreviation: DPA3B); and the like.

As carbazole derivatives which can be used for the composite material, the following can be given specifically: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like.

Moreover, as carbazole derivatives which can be used for the composite material, 4,4'-di(N-carbazolyl)biphenyl (abbreviation: CBP); 1,3,5-tris[4-(N-carbazolyl)phenyl]benzene (abbreviation: TCPB); 9-[4-(10-phenyl-9-anthracenyl)phenyl]-9H-carbazole (abbreviation: CzPA); 1,4-bis[4-(N-carbazolyl)phenyl]-2,3,5,6-tetraphenylbenzene; or the like can also be used.

As aromatic hydrocarbon which can be used for the composite material, the following can be given for example: 2-tert-butyl-9,10-di(2-naphthyl)anthracene (abbreviation: t-BuDNA); 2-tert-butyl-9,10-di(1-naphthyl)anthracene, 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 9,10-bis[2-(1-naphthyl)phenyl]-2-tert-butylanthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-

9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides, pentacene, coronene, or the like can also be used. In particular, an aromatic hydrocarbon which has a hole mobility of $1\times10^{-6}$ cm$^2$/Vs or higher and which has 14 to 42 carbon atoms is particularly preferable.

The aromatic hydrocarbon which can be used for the composite material may have a vinyl skeleton. As aromatic hydrocarbons having a vinyl group, the following are given as examples: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

For the hole-injecting layer, high molecular compounds (e.g., oligomer, dendrimer, or polymer) can be used. For example, the following high molecular compounds can be used: poly(N-vinylcarbazole) (abbreviation: PVK), poly(4-vinyl triphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine (abbreviation: Poly-TPD). Further, high molecular compounds mixed with acid such as poly(3,4-ethylenedioxythiophene)/poly(styrenesulfonic acid) (PEDOT/PSS) and polyaniline/poly(styrenesulfonic acid) (PAni/PSS) can also be used.

Note that it is also possible to form the hole-injecting layer using a composite material which is formed from the above-described high molecular compound such as PVK, PVTPA, PTPDMA, or Poly-TPD and the above-described substance having an acceptor property.

A hole-transporting layer 121 is a layer containing a substance having a high hole-transporting property. As a substance having a high hole-transporting property, for example, the following aromatic amine compounds can be used: aromatic amine compounds such as 4,4'-bis[N-(1-naphthyl)-N-phenylamino]biphenyl (abbreviation: NPB or α-NPD), N,N'-bis(3-methylphenyl)-N,N'-dipheny-[1,1'-biphenyl]-4,4'-diamine (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), N,N'-bis(spiro-9,9'-bifluoren-2-yl)-N,N'-diphenylbenzidine (abbreviation: BSPB). The substances described here are mainly substances having a hole mobility of $10^{-6}$ cm$^2$/Vs or higher. Further, other substances may also be used as long as the substances have hole-transporting properties higher than electron-transporting properties. Note that the layer containing a substance having a high hole-transporting property is not limited to a single layer but may have a stacked structure of two or more layers made of the above-described substances.

Further, the hole-transporting layer 121 can also be formed with high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine (abbreviation: Poly-TPD).

The light-emitting layer 122 is a layer containing a substance with a high light-emitting property. As the substance with a high light-emitting property, a fluorescent compound which emits fluorescence or a phosphorescent compound which emits phosphorescence can be used.

As the phosphorescent compound which can be used for the light-emitting layer, the following organometallic complexes are given. For example, as a blue light-emitting material, bis[2-(4',6'-difluorophenyl)pyridinato-N,C$^{2'}$]iridium (III)tetrakis(1-pyrazolyl)borate (abbreviation: FIr6); bis[2-(4',6'-difluorophenyl)pyridinato-N,C$^{2'}$]iridium(III)picolinate (abbreviation: FIrpic); bis[2-(3',5'bistrifluoromethylphenyl)pyridinato-N,C$^{2'}$]iridium(III)picolinate (abbreviation: Ir(CF$_3$ppy)$_2$(pic)); bis[2-(4',6'-difluorophenyl)pyridinato-N,C$^{2'}$]iridium(III)acetylacetonate (abbreviation: FIr(acac)); and the like are given. As a green light-emitting material, tris(2-phenylpyridinato-N,C$^{2'}$)iridium(III) (abbreviation: Ir(ppy)$_3$); bis(2-phenylpyridinato-N,C$^{2'}$)iridium(III)acetylacetonate (abbreviation: Ir(ppy)$_2$(acac)); bis(1,2-diphenyl-1H-benzimidazolato)iridium(III)acetylacetonate (abbreviation: Ir(pbi)$_2$(acac)); bis(benzo[h]quinolinato)iridium(III)acetylacetonate (abbreviation: Ir(bzq)$_2$(acac)); and the like are given. As a yellow light-emitting material, bis(2,4-diphenyl-1,3-oxazolato-N,C$^{2'}$)iridium(III)acetylacetonate (abbreviation: Ir(dpo)$_2$(acac)); bis[2-(4'-perfluorophenylphenyl)pyridinato]iridium(III)acetylacetonate (abbreviation: Ir(p-PF-ph)$_2$(acac)); bis(2-phenylbenzothiazolato-N,C$^{2'}$)iridium (III)acetylacetonate (abbreviation: Ir(bt)$_2$(acac)); and the like. As an orange light-emitting material, the following can be given: tris(2-phenylquinolinato-N,C$^{2'}$)iridium(III) (abbreviation: Ir(pq)$_3$); bis(2-phenylquinolinato-N,C$^{2'}$)iridium(III) acetylacetonate (abbreviation: Ir(pq)$_2$(acac)); and the like are given. As a red light-emitting material, bis[2-(2'-benzo[4,5-α]thienyl)pyridinato-N,C$^{3'}$)iridium(III)acetylacetonate (abbreviation: Ir(btp)$_2$(acac)); bis(1-phenylisoquinolinato-N,C$^{2'}$)iridium(III)acetylacetonate (abbreviation: Ir(piq)$_2$(acac)); (acetylacetonato)bis[2,3-bis(4-fluorophenyl)quinoxalinato]iridium(III) (abbreviation: Ir(Fdpq)$_2$(acac)); 2,3,7,8,12,13,17,18-octaethyl-21H,23H-porphyrinplatinum (II) (abbreviation: PtOEP); and the like are given. In addition, a rare-earth metal complex such as tris(acetylacetonato)(monophenanthroline)terbium(III) (abbreviation: Tb(acac)$_3$(Phen)); tris(1,3-diphenyl-1,3-propanedionato)(monophenanthroline)europium(III) (abbreviation: Eu(DBM)$_3$(Phen)); or tris[1-(2-thenoyl)-3,3,3-trifluoroacetonato](monophenanthroline)europium(III) (abbreviation: Eu(TTA)$_3$(Phen)) performs light emission (electron transition between different multiplicities) from a rare-earth metal ion; therefore, such a rare-earth metal complex can be used as the phosphorescent compound.

As the fluorescent compound which can be used for the light-emitting layer, for example, as a blue light-emitting material, N,N'-bis[4-(9H-carbazol-9-yl)phenyl]-N,N'-diphenylstilbene-4,4'-diamine (abbreviation: YGA2S); 4-(9H-carbazol-9-yl)-4'-(10-phenyl-9-anthryl)triphenylamine (abbreviation: YGAPA); and the like. As a green light-emitting material, the following can be given: N-(9,10-diphenyl-2-anthryl)-N,9-diphenyl-9H-carbazol-3-amine (abbreviation: 2PCAPA); N-[9,10-bis(1,1'-biphenyl-2-yl)-2-anthryl]-N,9-diphenyl-9H-carbazol-3-amine (abbreviation: 2PCABPhA); N-(9,10-diphenyl-2-anthryl)-N,N',N'-triphenyl-1,4-phenylenediamine (abbreviation: 2DPAPA); N-[9,10-bis(1,1'-biphenyl-2-yl)-2-anthryl]-N,N',N'-triphenyl-1,4-phenylenediamine (abbreviation: 2DPABPhA); 9,10-bis(1,1'-biphenyl-2-yl)-N-[4-(9H-carbazol-9-yl)phenyl]-N-phenylanthracen-2-amine (abbreviation: 2YGABPhA); N,N,9-triphenylanthracen-9-amine (abbreviation: DPhAPhA); and the like are given. As a yellow light-emitting material, the following can be given: rubrene; 5,12-bis(1,1'-biphenyl-4-yl)-6,11-diphenyltetracene (abbreviation: BPT); and the like. As a red light-emitting material, N,N,N',N'-tetrakis(4-methylphenyl)tetracene-5,11-diamine (abbreviation: p-mPhTD); 7,13-diphenyl-N,N,N',N'-tetrakis(4-methylphenyl)acenaphtho[1,2-α]fluoranthene-3,10-diamine (abbreviation: p-mPhAFD); and the like are given.

Alternatively, a substance with a high light-emitting property can be dispersed in another substance. When a structure in which a substance having a high light-emitting property is dispersed in another substance is employed, crystallization of the light-emitting layer can be suppressed. Further, concentration quenching which results from the high concentration of the substance having a high light-emitting property can be also suppressed.

As a substance for dispersing the light-emitting substance, when a light-emitting substance is a fluorescent compound, a substance having singlet excitation energy (the energy difference between a ground state and a singlet excited state) higher than the fluorescent compound is preferably used. On the other hand, when a light-emitting substance is a phosphorescent compound, a substance having triplet excitation energy (the energy difference between a ground state and a triplet excited state) higher than the phosphorescent compound is preferably used as a substance for dispersing the light-emitting substance.

The electron-transporting layer 123 is a layer that contains a substance with a high electron-transporting property. For example, a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq), or the like can be used. Alternatively, a metal complex having an oxazole-based or thiazole-based ligand, such as bis[2-(2-hydroxyphenyl)benzoxazolato]zinc (abbreviation: Zn(BOX)$_2$), bis[2-(2-hydroxyphenyl)benzothiazolato]zinc (abbreviation: Zn(BTZ)$_2$), or the like can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The materials mentioned here mainly are substances each having an electron mobility of $10^{-6}$ cm$^2$/Vs or higher. The electron-transporting layer may be formed of other materials than those described above as long as the substances have electron-transporting properties higher than hole-transporting properties. Furthermore, the electron-transporting layer is not limited to a single layer, and two or more layers made of the aforementioned substances may be stacked.

As the electron-transporting layer 123, a high-molecular compound can be used. For example, poly[(9,9-dihexylfluorene-2,7-diyl)-co-(pyridine-3,5-diyl)] (abbreviation: PF-Py) or poly[(9,9-dioctyllfluorene-2,7-diyl)-co-(2,2'-pyridine-6,6'-diyl)] (abbreviation: PF-BPy) can be used.

In addition, an electron-injecting layer 124 may be provided. As the electron-injecting layer 124, an alkali metal compound, or an alkaline earth metal compound such as lithium fluoride (LiF), cesium fluoride (CsF), or calcium fluoride (CaF$_2$) may be used. Further, a layer formed by combination of a substance having an electron-transporting property with an alkali metal or an alkaline earth metal can be used. For example, Alq which contains magnesium (Mg) may be used. By using a layer formed by combination of a substance having an electron-transporting property with an alkali metal or an alkaline earth metal as the electron-injecting layer, electron injection from the second electrode 102 is performed efficiently, which is preferable.

In the light-emitting element having the above structure, which is described in this embodiment mode, application of voltage between the first electrode 101 and the second electrode 102 makes current flow, whereby holes and electrons are recombined in the light-emitting layer 122 that is a layer including a substance having a high light-emitting property, and light is emitted. That is, a light-emitting region is formed in the light-emitting layer 122.

Figure 2:
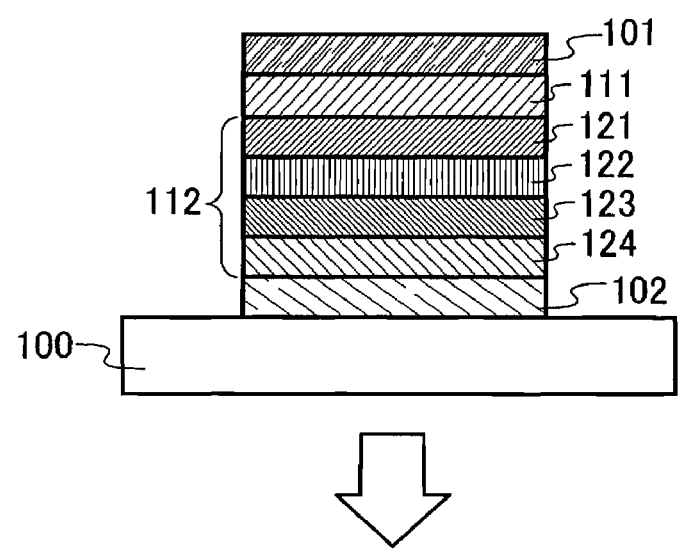
FIG. 2 illustrates a light-emitting element according to an aspect of the present invention.

FIG. 1 illustrates a top emission type light-emitting element in which light emission from the light-emitting layer is extracted to the outside through the second electrode 102; however, it is possible that the second electrode 102 serving as a cathode is provided on the substrate 100 side. FIG. 2 illustrates a structure in which a second electrode 102 serving as a cathode, a second layer 112, a first layer 111 and a first electrode 101 are sequentially stacked over a substrate 100. In FIG. 2, a bottom emission type light-emitting element is exemplified, in which light emission from a light-emitting layer 122 included in the second layer 112 is extracted to the outside through the second electrode 102 and the substrate 100.

As the formation method of the first layer 111 and the second layer 112, various methods can be employed, irrespective of a dry method or a wet method. It is to be noted that each electrode and each layer may be formed by a different formation method. A vacuum evaporation method, a sputtering method, or the like can be employed as a dry process. An ink-jet method, a spin-coating method, or the like can be employed as a wet process.

For example, among the above-described materials, a high molecular compound may be used to form the first layer 111 or the second layer 112 by a wet process. Alternatively, a low molecular organic compound may be used to form the first layer 111 or the second layer 112 by a wet process. Further, it is also possible to form the first layer 111 or the second layer 112 by depositing a low molecular organic compound by using a dry process such as a vacuum evaporation method.

Similarly, each electrode can be formed by a wet process such as a sol-gel process or by a wet process using a paste of a metal material. Alternatively, each electrode may be formed by a dry process such as a sputtering method or a vacuum evaporation method.

When the light-emitting element described in this embodiment mode is applied to a display device and its light-emitting layer is selectively deposited according to each color, the light-emitting layer is preferably formed by a wet process. When the light-emitting layer is formed by an ink-jet method, selective deposition of the light-emitting layer for each color can be easily performed even in the case of a large sized substrate, and thus productivity is improved.

In this embodiment mode, the light-emitting element is formed over a substrate made of glass, plastic, or the like. By manufacturing a plurality of the light-emitting elements described above over one substrate, a passive-matrix light-emitting device can be manufactured. Alternatively, for example, a thin film transistor (TFT) may be formed over a substrate made of glass, plastic, or the like, and the light-emitting elements may be manufactured over an electrode electrically connected to the TFT. According to this, an active matrix type light-emitting device can be manufactured, in which driving of the light-emitting element is controlled by a TFT. There is no particular limitation on a structure of the TFT. The TFT may be either of staggered type or inverted staggered type. In addition, a driver circuit formed over a TFT substrate may be formed using n-channel and p-channel TFTs, or using either an n-channel TFT or a p-channel TFT. In addition, there is no particular limitation on the crystallinity of a semiconductor film used in the TFT. An amorphous semiconductor film may be used, or a crystalline semiconductor film may be used. An amorphous semiconductor film may also be used, or a crystalline semiconductor film may also be used. In addition, a single crystal semiconductor film may be used. The single crystal semiconductor film can be formed by a Smart Cut (registered trademark) method.

Through the above steps, a light-emitting element and a light-emitting device in which reflection of external light on the first electrode 101 can be suppressed can be provided. As a result, a contrast can be enhanced and thus a light-emitting device which does not need a polarizing plate or the like can be provided.

Note that this embodiment mode can be combined with any of the other embodiment modes as appropriate.

Embodiment Mode 2

Embodiment Mode 2 will describe a light-emitting element with a structure different from the structure shown in Embodiment Mode 1. In this embodiment mode, a light-emitting element in which a light-absorbing layer is provided in contact with an electrode serving as a cathode is described with reference to FIG. 3.

Figure 3:
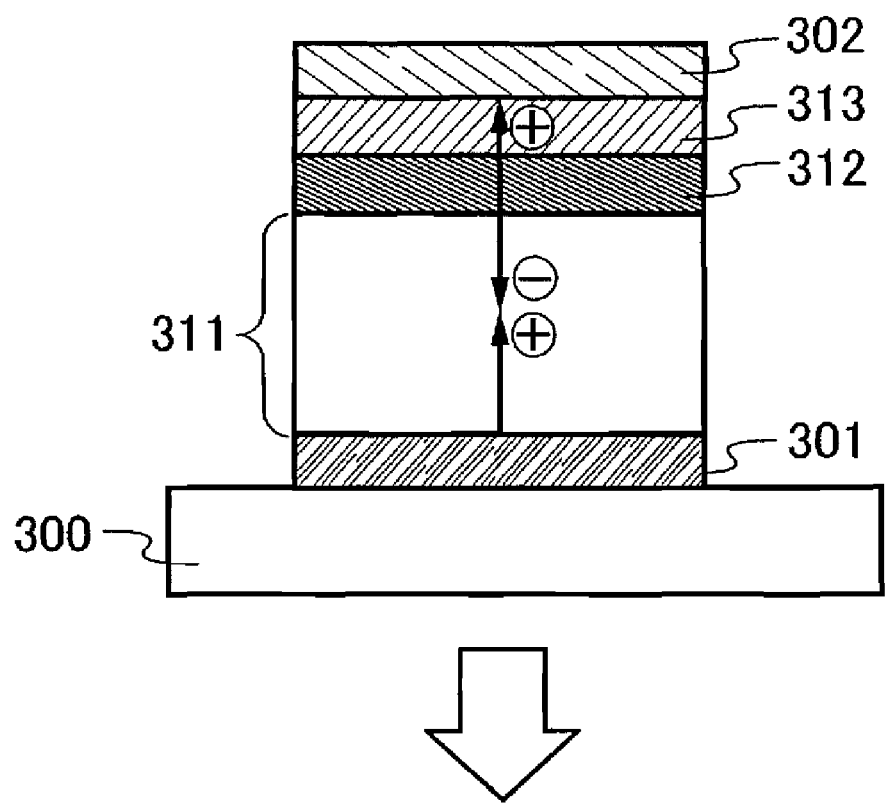
FIG. 3 illustrates a light-emitting element according to an aspect of the present invention.

FIG. 3 illustrates a light-emitting element in which a first electrode 301 formed over a substrate 300, a second electrode 302 opposite to the first electrode 301, and a first layer 311, a second layer 312 and a third layer 313 sequentially formed between the first electrode 301 and the second electrode 302 are provided.

In FIG. 3, the substrate 300 is used as a support of the light-emitting element. The substrate 300 can have a structure similar to the substrate 100 in Embodiment Mode 1.

In this embodiment mode, the light-emitting element includes the first electrode 301, the second electrode 302, and the first layer 311, the second layer 312 and the third layer 313 which are formed between the first electrode 301 and the second electrode 302. Note that in the description of this embodiment mode, the first electrode 301 serves as an anode and the second electrode 302 serves as a cathode. In other words, in the description below, it is assumed that light emission is obtained when voltage is applied to the first electrode 301 and the second electrode 302 such that the potential of the first electrode 301 becomes higher than that of the second electrode 302.

As the first electrode 301, an electrode having a similar structure to the first electrode 101 in Embodiment Mode 1 can be used. As described in Embodiment Mode 1, in a case where a layer containing a composite material is used as a hole-injecting layer in contact with the first electrode 301, various metals, alloys, electrically conductive compounds, mixtures thereof, or the like can be used for the first electrode 301 regardless of the work function.

The first layer 311 can have a structure similar to the second layer 112 in Embodiment Mode 1. In other words, a layer including a substance with a high electron-transporting property, a substance with a high hole-transporting property, a substance with a high electron-injecting property, a substance with a high hole-injecting property, a bipolar substance (a substance with high electron-transporting and hole-transporting properties), or the like may be combined with a light-emitting layer as appropriate.

The second layer 312 is a layer including a substance having a high electron-donating property and a substance having a high electron-transporting property. An electron-donating substance is preferably an alkaline metal, an alkaline earth metal, oxide or salt thereof. Specifically, there are given lithium, cesium, calcium, lithium oxide, calcium oxide, barium oxide, cesium carbonate, and the like. For example, a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato) beryllium (abbreviation: BeBq$_2$), or bis(2-methyl-8-quinolinolato)(4-phenylphenolato)aluminum (abbreviation: BAlq), or the like can be used. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like can be used. Besides the metal complexes, 2-(4-biphenylyl)-5-(4-tert-butylphenyl)-1, 3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The materials mentioned here mainly are substances each having an electron mobility of $10^{-6}$ cm$^2$/Vs or higher. Other substances than those described above may be used as long as the substances have electron-transporting properties higher than hole-transporting properties. Further, a high-molecular compound can be used. For example, poly[(9,9-dihexylfluorene-2,7-diyl)-co-(pyridin-3, 5-diyl)] (abbreviation: PF-Py) or poly[(9,9-dioctylfluorene-2,7-diyl)-co-(2,2'-bipyridine-6,6'-diyl)] (abbreviation: PF-BPy) can be used.

The third layer 313 has a function of a light-absorbing layer, and external light entering the element through the first electrode 101 and external light reflected on the second electrode 102 can be absorbed. In this case, the thickness and the dose amount of a halogen atom are preferably determined such that the absorptance with respect to estimated intensity of external light is 50% or higher. In this manner, in accordance with the present invention, only light from either the first layer 111 or the second layer 112 can be obtained without being subjected to influence of reflection of external light.

The third layer 313 can have a structure similar to the first layer 111 described in Embodiment Mode 1.

Moreover, the second electrode 302 can have a similar structure to the second electrode 102 described in Embodiment Mode 1. In this embodiment mode, since the third layer 313 is provided in contact with the second electrode 302, a wide variety of metals, alloys, electrically conductive compounds and mixture thereof can be used as the first electrode 301, irrespective of its work function.

In the light-emitting element with such a structure, electrons are given and received in the vicinity of an interface between the second layer 312 and the third layer 313 by applying a voltage as shown in FIG. 3, and electrons and holes are generated. At this time, the second layer 312 transports electrons to the first layer 311 while the third layer 313 transports holes to the second electrode 302. Accordingly, the second layer 312 and the third layer 313 collectively function as a carrier generating layer. Further, it can be said that the third layer 313 has a function of transporting holes to the second electrode 302.

The third layer 313 shows extremely high hole-injecting property and hole-transporting property. Therefore, a drive voltage of the light-emitting element can be reduced. Further, even in the case where the third layer 313 is formed thick, the driving voltage can be prevented from increasing.

Even when the thickness of the third layer 313 is increased, the increase of driving voltage can be suppressed, and thus the thickness of the third layer 313 can be freely set. In this way, the absorptance can be further improved while suppressing an increase of driving voltage.

When taking FIG. 3 for instance, if the second electrode 302 is deposited by sputtering, damages to the first layer 311 including the light-emitting layer can be reduced.

Although FIG. 3 illustrates a structure in which the first electrode 301 functions as an anode is disposed on the substrate 300 side, the second electrode 302 that functions as a cathode may be disposed on the substrate 300 side.

As a method of forming each electrode or each layer, various methods can be used regardless of a dry process or a wet process. It is to be noted that each layer or each electrode can be formed by a different method.

Through the above-described steps, a light-emitting device can be obtained, in which reflection of external light on the second electrode 302 is suppressed. Accordingly, a contrast can be enhanced and a light-emitting device which does not need a polarizing plate or the like can be provided.

Note that this embodiment mode can be combined with any of the other embodiment modes as appropriate.

Embodiment Mode 3

Embodiment Mode 4 will describe a light-emitting device including a light-emitting element of the present invention.

In this embodiment mode, a light-emitting device having the light-emitting element of the present invention in a pixel portion is described with reference to FIGS. 7A and 7B. It is to be noted that FIG. 7A is a top view showing the light-emitting device and FIG. 7B is a cross-sectional view taken along line A-A' and B-B' of FIG. 7A. This light-emitting device includes a driver circuit portion (source side driver circuit) 601, a pixel portion 602, and a driver circuit portion (gate side driver circuit) 603 in order to control the light emission of the light-emitting element. Also, a reference numeral 604 represents a sealing substrate, a reference numeral 605 represents a sealant, and the inside that is surrounded by the sealant 605 is a space 607.

A leading wiring 608 is a wiring for transmitting a signal to be inputted to the source driver circuit 601 and the gate driver circuit 603, and this wiring 608 receives a video signal, a clock signal, a start signal, a reset signal, and the like from an FPC (flexible printed circuit) 609 that is an external input terminal. Although only the FPC is illustrated here, this FPC may be provided with a printed wiring board (PWB). The light-emitting device in this specification includes not only the light-emitting device body itself but also a state in which an FPC or a PWB is attached thereto.

Next, the cross-sectional structure is described with reference to FIG. 7B. The driver circuit portions and the pixel portion are formed over an element substrate 610. Here, the source driver circuit 601 which is the driver circuit portion and one pixel in the pixel portion 602 are shown.

A CMOS circuit combining an n-channel type TFT 623 and a p-channel type TFT 624 is formed for the source side driving circuit 601. The driver circuit may be formed by various CMOS circuits, PMOS circuits, or NMOS circuits. A driver integration type in which a driver circuit is formed over the substrate is described in this embodiment, but it is not necessarily required and a driver circuit can be formed not over the same substrate as the pixel portion but outside the substrate.

The pixel portion 602 has a plurality of pixels, each of which includes a switching TFT 611, a current control TFT 612, and a first electrode 613 that is electrically connected to a drain of the current control TFT 612. Note that an insulator 614 is formed so as to cover an end portion of the first electrode 613. In this embodiment mode, the insulator 614 is formed using a positive photosensitive acrylic resin.

In order to obtain favorable coverage, the insulator 614 is formed to have a curved surface with curvature at an upper end portion or a lower end portion thereof. For example, in the case of using a positive photosensitive acrylic resin as a material for the insulator 614, the insulator 614 is preferably formed so as to have a curved surface with a curvature radius (0.2 μm to 3 μm) only at the upper end portion thereof. Either a negative type which becomes insoluble in an etchant by light irradiation or a positive type which becomes soluble in an etchant by light irradiation can be used as the insulator 614.

An EL layer 616 and a second electrode 617 are formed over the first electrode 613. Various metals, alloys, electrically conductive compounds, or a mixture thereof can be used for a material for forming the first electrode 613. When the first electrode serves as an anode, among the above materials, a metal, alloy, electrically conductive compound, or mixture of these, each having a high work function (specifically, a work function of 4.0 eV or higher) is preferable. For example, the first electrode 613 can be formed using a single layer film of an indium tin oxide film containing silicon, an indium zinc oxide film, a titanium nitride film, a chromium film, a tungsten film, a Zn film, a Pt film, or the like; or a stacked film, such as a stack of a titanium nitride film and a film containing aluminum as its main component or a three-layer structure of a titanium nitride film, a film containing aluminum as its main component, and a titanium nitride film. When the first electrode 613 has a stacked structure, the first electrode 613 shows a resistance low enough to serve as a wiring, giving a good ohmic contact, and can function as an anode.

In addition, the EL layer 616 is formed by various methods such as an evaporation method using an evaporation mask, an ink-jet method, and a spin coating method. The EL layer 616 includes the light-emitting layer shown in Embodiment Modes 1 and 2. Any of low molecular compounds, high molecular compounds, oligomers and dendrimers may be employed as the material used for the EL layer 616. In addition, not only an organic compound but also an inorganic compound may be used for the material for the EL layer 616.

As a material for forming the second electrode 617, a wide variety of materials, such as metals, alloys, electrically conductive compounds, or mixture of them can be used. If the second electrode is used as a cathode, it is preferable to use, among those materials, a metal, an alloy, an electroconductive compound, a mixture thereof, or the like with a low work function (a work function of 3.8 eV or lower). For example, Group 1 and Group 2 elements of the periodic table, that is, alkali metals such as lithium (Li) and cesium (Cs) and alkaline-earth metals such as magnesium (Mg), calcium (Ca), and strontium (Sr), alloys thereof (MgAg, AlLi), or the like can be given. In the case where light generated in the EL layer 616 is transmitted through the second electrode 617, the second electrode 617 is preferably formed with a stacked layer of a metal thin film whose thickness is made small, and a transparent conductive film (indium tin oxide (ITO), indium tin oxide including silicon or silicon oxide, indium zinc oxide (IZO), indium oxide containing tungsten oxide and zinc oxide (IWZO), or the like).

By attachment of the sealing substrate 604 to the element substrate 610 with the sealant 605, a light-emitting element 618 is provided in the space 607 surrounded by the element substrate 610, the sealing substrate 604, and the sealant 605. Note that the space 607 is filled with a filler. There are cases where the space 607 may be filled with an inert gas (such as nitrogen or argon) as such a filler, or where the space 607 may be filled with the sealant 605.

Note that an epoxy-based resin is preferably used as the sealant 605. In addition, it is preferable that the material do not transmit moisture and oxygen as much as possible. As the sealing substrate 604, a plastic substrate formed of FRP (Fiberglass-Reinforced Plastics), PVF (polyvinyl fluoride), a polyester film, polyester, acrylic, or the like can be used, as well as a glass substrate or a quartz substrate.

In the above manner, the light-emitting device having the light-emitting element of the present invention can be obtained.

The light-emitting device of the present invention includes the light-emitting element described in Embodiment Mode 1 or 2, and thus suppresses reflection of external light and has a high contrast.

Figure 8A:
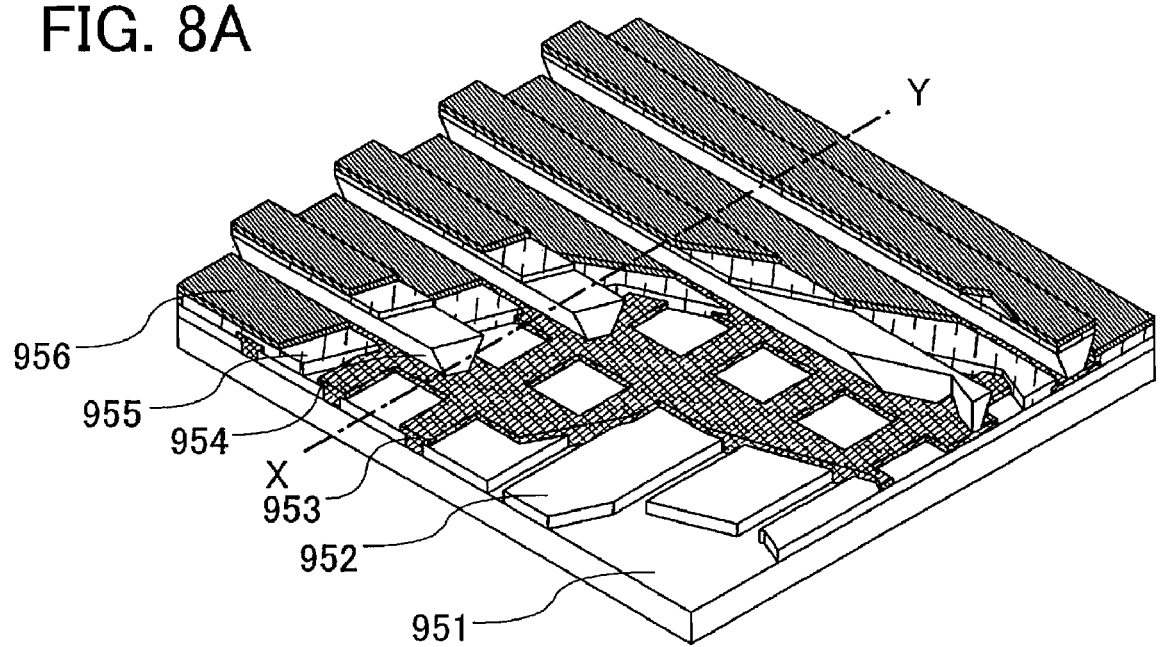
FIGS. 8A and 8B illustrate a light-emitting device according to an aspect of the present invention.
Figure 8B:
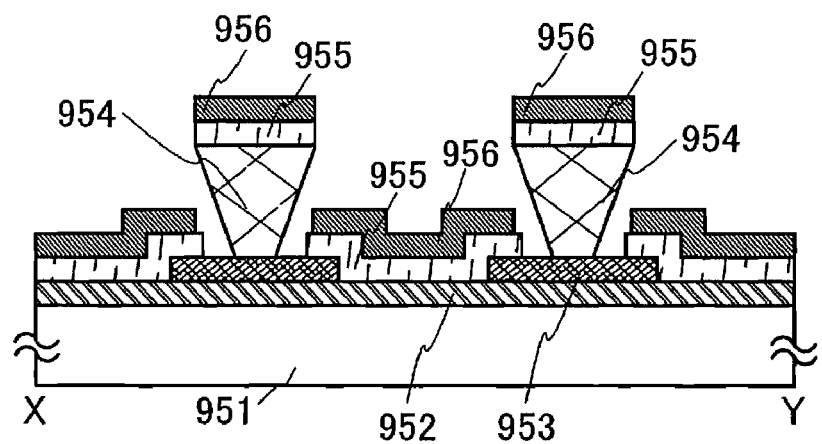

This embodiment mode has described the active light-emitting device in which the driving of the light-emitting element is controlled by a transistor. However, a passive light-emitting device may be adopted. A perspective-view diagram of a passive matrix light-emitting device fabricated by application of the present invention is shown in FIGS. 8A and 8B. It is to be noted that FIG. 8A is a perspective-view diagram of the light-emitting device and FIG. 8B is a cross-sectional view taken along X-Y in FIG. 8A. In FIGS. 8A and 8B, an EL layer 955 is provided between an electrode 952 and an electrode 956 over a substrate 951. An end portion of the electrode 952 is covered with an insulating layer 953. A partition layer 954 is provided over the insulating layer 953. Sidewalls of the partition layer 954 are slanted so that a distance between one of the sidewalls and the other becomes narrower toward a substrate surface. In other words, a cross section of the partition layer 954 in the direction of a narrow side is trapezoidal, and a base (a side facing in the same direction as a plane direction of the insulating layer 953 and in contact with the insulating layer 953) is shorter than an upper side (a side facing in the same direction as the plane direction of the insulating layer 953 and not in contact with the insulating layer 953). Fabrication of the partition layer 954 in this manner allows patterning the cathode. Also in the passive matrix type light-emitting device, by using a long-life light-emitting element, a long-life light-emitting device can be provided. Further, a light-emitting device with low power consumption can be provided.

Note that this embodiment mode can be combined with any of the other embodiment modes as appropriate.

Embodiment Mode 4

Embodiment Mode 4 will describe a cross-sectional structure of a pixel in a case where a transistor for controlling current to a light-emitting element (hereinafter, a driving transistor) is a p-channel TFT. In this embodiment mode, description is made on the assumption that the first electrode serves as an anode and the second electrode serves as a cathode.

Figure 4:
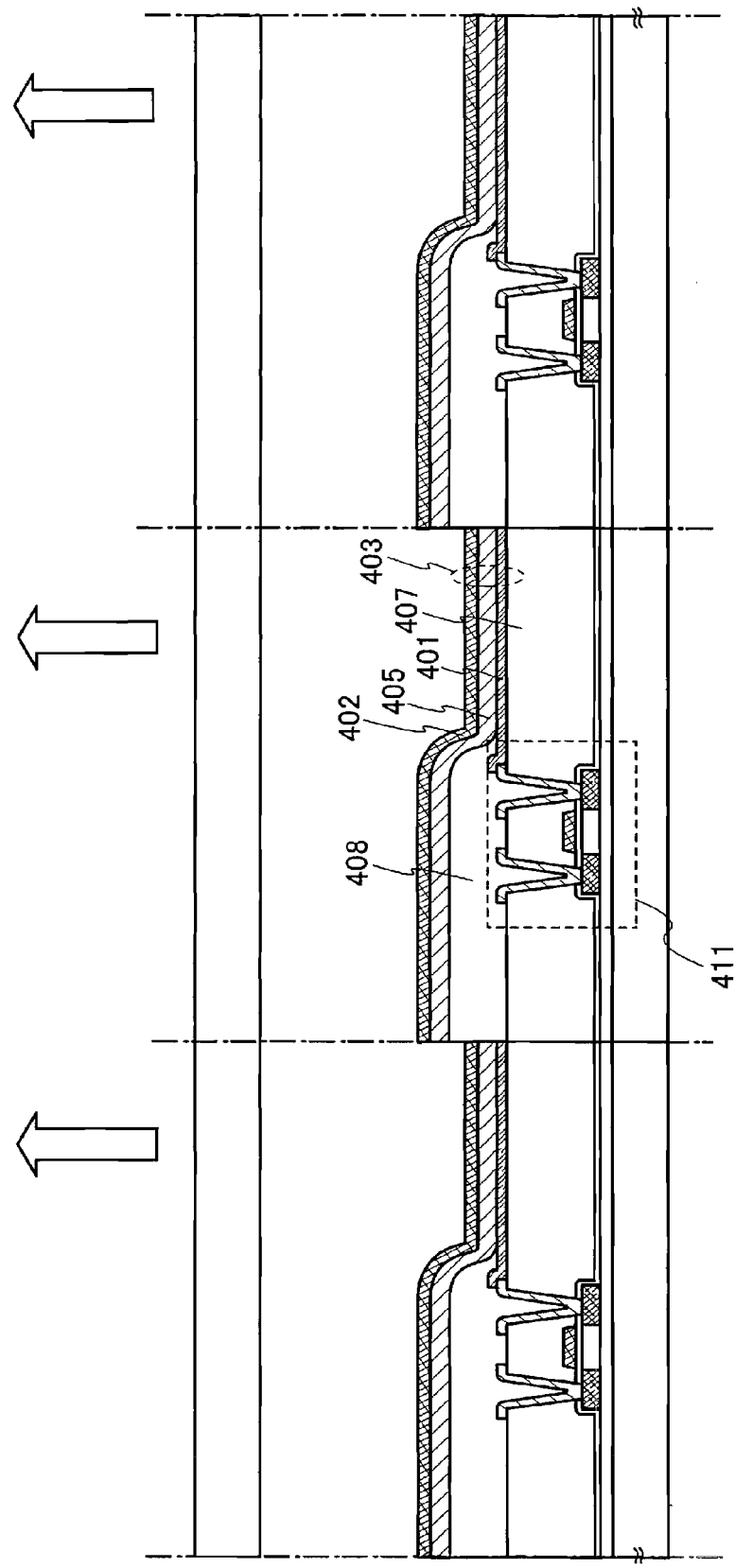
FIG. 4 illustrates a light-emitting device according to an aspect of the present invention.

In FIG. 4, a cross-sectional view of three pixels in a top emission type light-emitting device is illustrated, in which a TFT 411 is a p-channel type, and light emitted from a light-emitting element 403 is extracted through a second electrode 402. In FIG. 4, the first electrode 401 of the light-emitting element 403 is electrically connected to the TFT 411. An EL layer 405 adjacent to the first electrode 401, and the second electrode 402 adjacent to the EL layer are sequentially stacked. The light-emitting element 403 can have any structure described in Embodiment Modes 1 and 2.

The TFT 411 is 10 nm to 200 nm thick, and its channel forming region is formed with an island-shape semiconductor film. Any of an amorphous semiconductor film, a crystalline semiconductor film, and a microcrystalline semiconductor film may be used as the semiconductor film. Alternatively, a single crystalline semiconductor film may be used. For example, in a case of using a crystalline semiconductor film, an amorphous semiconductor film is formed first and heated to be crystallized by heat treatment to form a crystalline semiconductor film. The heat treatment can be performed using a heating furnace, laser irradiation, radiation of light emitted from a lamp (hereinafter, referred to as lamp annealing) instead of laser light, or a combination thereof.

In the case of laser irradiation, a continuous wave (CW) laser or a pulsed laser can be used.

Further, in the case of laser irradiation, an incident angle of laser may be set to be $\theta$ ($0° < \theta < 90°$) with respect to the semiconductor film. As a result, laser interference can be prevented.

Note that irradiation of laser light of a fundamental wave of a continuous wave laser and laser light of a harmonic of a continuous wave laser may be conducted, or irradiation of laser light of a fundamental wave of a continuous wave laser and laser light of a harmonic of a pulsed laser may be conducted. By emitting a plurality of laser light, energy can be compensated.

In the case of the pulsed laser, a pulsed laser light is oscillated with such a repetition rate that the laser light of the next pulse is emitted before the semiconductor film that has been melted solidifies. This makes it possible to obtain crystal grains which are sequentially grown in the scanning direction. In other words, That is, a pulsed laser with a lower limit of repetition rate set so that the pulse repetition period is shorter than a period for solidifying completely the semiconductor film which has been melted can be used. The pulsed beam that can be used actually is a repetition rate of 10 MHz or more. This repetition rate is extremely higher than that of the pulsed laser used usually, which is from several tens Hz to several hundred Hz, to perform laser crystallization.

As another crystallization method using heat treatment, in the case of using a heating furnace, an amorphous semiconductor film is heated at temperature of from 500° C. to 550° C. for 2 to 20 hours. At this time, the temperature is preferably set in multiple stages in the range of 500° C. to 550° C. so as to be a higher temperature gradually. Since hydrogen or the like of the amorphous semiconductor film is released in the first low temperature heating process, film roughness caused in crystallization can be reduced, and dangling bonds can be terminated. When a metal element for promoting crystallization, e.g., Ni is further formed over the amorphous semiconductor film, the heat temperature can be lowered, which is preferable. Even in the case of crystallization using such a metal element, heat treatment may be performed at a temperature of 600° C. to 950° C.

However, in the case of forming a metal element, there is a concern that the metal element may adversely affect electric characteristics of a semiconductor element. Thus, a gettering step is required to reduce or remove the metal element. For example, the step of gettering the metal element may be performed using the amorphous semiconductor film as a gettering sink.

Further, the TFT 411 includes a gate insulating film covering the semiconductor film, and a gate electrode in which a first conductive film and a second conductive film are stacked. An insulating film containing hydrogen is formed over the gate electrode. Also by the hydrogen, dangling bonds can be terminated.

The TFT 411 is a p-channel transistor. The TFT 411 has a so-called single drain structure only having a high-concentration impurity region in the semiconductor film. Alternatively, the TFT 411 may have an LDD (Lightly Doped Drain) structure in which a low concentration impurity region and a high concentration impurity region are provided in the semiconductor film or a GOLD (Gate Overlapped Drain) structure in which the impurity region is overlapped with the gate electrode.

The TFT 411 is covered with an interlayer insulating film 407, and a partition wall 408 having an opening is formed over the interlayer insulating film 407. The first electrode 401 is partially exposed in the opening of the partition wall 408, and the first electrode 401, the EL layer 405, and the second electrode 402 are sequentially stacked in the opening portion.

The EL layer 405 includes the light-absorbing layer described in Embodiment Mode 1 or Embodiment Mode 2, and the light-absorbing layer is formed so as to reduce reflection of external light on the first electrode 401. In addition, the light-absorbing layer is also formed over a region in which the TFT is formed.

This embodiment mode shows a top emission type; thus, the first electrode 401 has a non-light-transmitting property and the second electrode 402 has a light-transmitting property. The structure of these electrodes can be referred to as the above embodiment modes.

As described above, the EL layer 405 includes a light-absorbing layer or the like, in addition to the light-emitting layer.

In the case of the pixel shown in FIG. 4, light emitted from the light-emitting element 403 can be extracted through the second electrode 402 as indicated by a hollow arrow.

Also, reflection of external light on the TFT portion in which an opening portion is not formed is reduced by the EL layer 405 including the light-absorbing layer.

As described above, reflection of external light in a light-emitting portion and a non-light-emitting portion is reduced, and thus a light-emitting device can be provided, whose contrast is enhanced and which does not need a polarizing plate or the like.

Note that this embodiment mode can be combined with any the other embodiment modes as appropriate.

Embodiment Mode 5

In Embodiment Mode 5, an equivalent circuit diagram of a pixel having a light-emitting element is described with reference to FIGS. 5A to 5D.

Figure 5A:
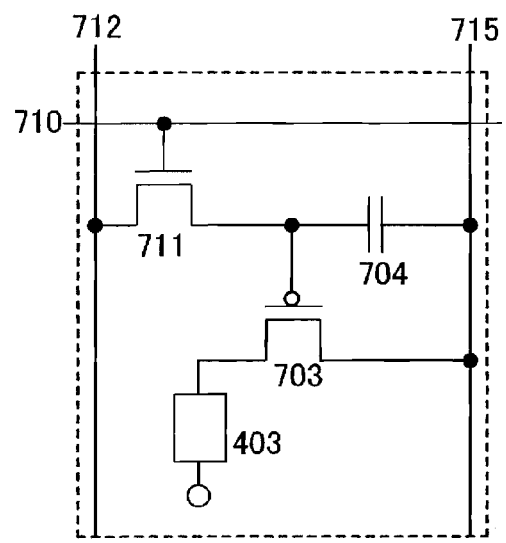
FIGS. 5A to 5D each illustrate a light-emitting device according to an aspect of the present invention.

FIG. 5A is an example of an equivalent circuit diagram of a pixel, which includes a signal line 712, a power supply line 715, a scan line 710, a light-emitting element 403, transistors 703 and 711, and a capacitor 704 at the intersection portion formed by the signal line 712, the power supply line 715 and the scan line 710.

In this equivalent circuit, the signal line 712 is inputted with a video signal by a signal line driver circuit. The transistor 711 can control supply of the video signal to a gate of the transistor 703 in accordance with a selection signal inputted to the scan line 710. The transistor 703 is a driving transistor that can control supply of current to the light-emitting element 403 in accordance with the potential of the video signal. The capacitor 704 can hold voltage between a gate and a source of the transistor 703. Note that the capacitor 704 is provided in FIG. 5A; however, it is not required to be provided if the gate capacitance of the transistor 703 or the other parasitic capacitance can substitute for it.

Figure 5B:
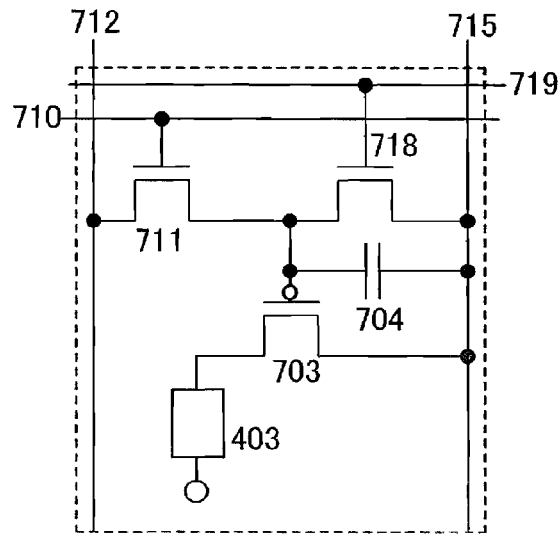

FIG. 5B is an equivalent circuit diagram of a pixel where a transistor 718 and a scan line 719 are additionally provided in the pixel shown in FIG. 5A.

By the transistor 718, potentials of the gate and a source of the transistor 703 can be equal to each other so as to forcibly flow no current into the light-emitting element 403. The transistor 703 is referred to as an erase transistor. Therefore, in time gray scale display, the next video signal can be input before inputting video signals into all pixels, and the duty ratio can be thus made higher.

Alternatively, an element that functions as a diode may be provided instead of the transistor 718. In this embodiment mode, a diode junction transistor or a pn-junction diode can be provided between the gate electrode of the transistor 703 and the scan line 719. Then, a state in which no current flows into the light-emitting element 403 can be forcibly made.

Figure 5C:
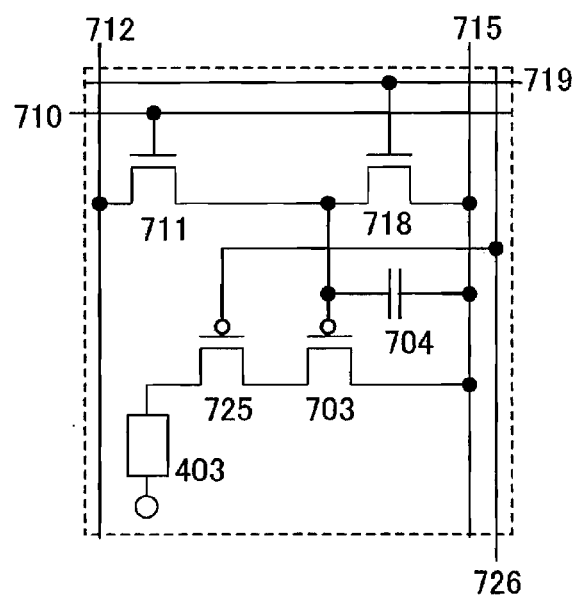

FIG. 5C is an equivalent circuit diagram of a pixel where a transistor 725 and a wiring 726 are additionally provided in the pixel shown in FIG. 5B. Gate potential of the transistor 725 is fixed. The gate potential of the transistor 725 is fixed with being connected to the wiring 726, for example. In addition, the transistors 703 and 725 are connected in series between the power supply line 715 and the light-emitting element 403. In FIG. 5C, accordingly, the transistor 725 controls the amount of current supplied to the light-emitting element 403 while the transistor 703 controls whether the current is supplied or not to the light-emitting element 403.

The equivalent circuits of the pixels shown in FIGS. 5A to 5C can be driven by a digital method. In the case of driving the equivalent circuits by a digital method, some variations in electrical characteristics of each driving transistor are negligible, since the transistors are used as switching elements.

Figure 5D:
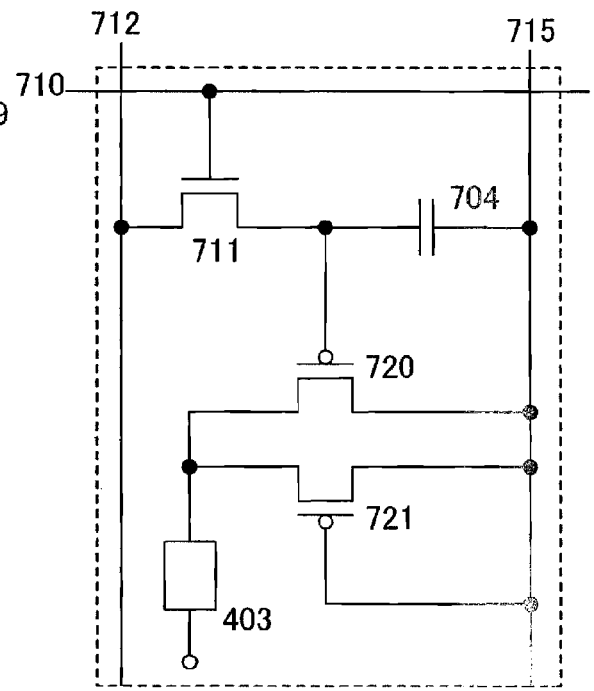

An equivalent circuit of a pixel of a light-emitting device according to the present invention can be driven by either a digital method or an analog method. For example, an equivalent circuit of a pixel shown in FIG. 5D includes a signal line 712, a power supply line 715, and a scan line 710, and at an intersecting point thereof, a light-emitting element 708, transistors 711, 720, and 721, and a capacitor 704. In FIG. 5D, the transistors 720 and 721, which are p-channel transistors, form a current mirror circuit. In such an equivalent circuit of a pixel, in the case of a digital method, a digital video signal is inputted from the signal line 712, and the value of a current supplied to the light-emitting element 403 is controlled in accordance with a time grayscale. In the case of an analog method, an analog video signal is inputted from the signal line 712, and the value of the current supplied to the light-emitting element 403 is controlled in accordance with the value of the analog video signal. In the case of driving the equivalent circuit by the analog method, lower power consumption can be achieved.

In each pixel described above, signals are inputted to the signal line 712, the power supply line 715, and the wiring 726 from a signal line driver circuit. In addition, signals are inputted to the scan lines 710 and 719 from a scan line driver circuit. One or more signal line driver circuits and one or more scan line driver circuits can be provided. For example, first and second scan line driver circuits can be provided through a pixel portion.

In addition, in the pixel shown in FIG. 5A, a state in which no current flows into the light-emitting element 403 can be forcibly made as described with reference to FIG. 5B. For example, the transistor 711 is selected by a first scan line driver circuit at the moment when the light-emitting element 403 lights up and a signal for forcibly applying no current into the light-emitting element 403 is supplied to the scan line 710 by a second scan line driver circuit. The signal for forcibly applying no current (Write Erase Signal) is a signal for applying such an electric potential that first and second electrodes 101 and 102 of the light-emitting element 403 can have equal electric potential. In this way, a state where no current flows into the light-emitting element 403 can be forcibly made by the driving method, and the duty ratio can be thus made higher.

As described above, a variety of equivalent circuits of a pixel of a light-emitting device according to the present invention can be employed. Note that a pixel circuit according to the present invention is not limited to the structure shown in this embodiment mode. The present embodiment can be freely combined with the embodiments described above.

Embodiment Mode 6

Electronic devices provided with a light-emitting device according the present invention include: a television set (simply referred to as a TV, or a television receiver), cameras such as a digital camera and a digital video camera, a mobile phone set (simply referred to as a cellular phone set, or a cellular phone), a portable information terminal such as PDA (personal digital assistant), a portable game machine, a monitor for a computer, a computer, a sound reproducing device such as a car audio set, an image reproducing device provided with a recording medium such as a home game machine, and the like. Specific examples thereof are described with reference to FIGS. 6A to 6F.

Figure 6A:
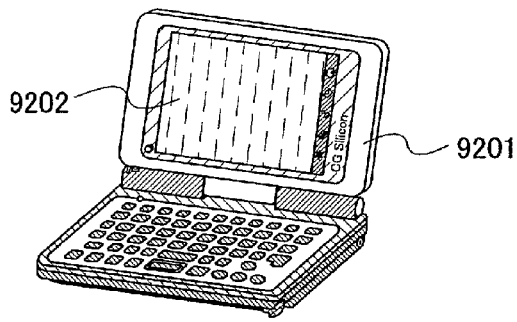
FIGS. 6A to 6F each illustrate an electronic device according to an aspect of the present invention

A portable information terminal shown in FIG. 6A includes a main body 9201, a display portion 9202 and the like. The light-emitting device of the present invention can be applied to the display portion 9202. As a result, the portable information terminal whose contrast is excellent and which does not need a polarizing plate or the like can be provided.

Figure 6B:
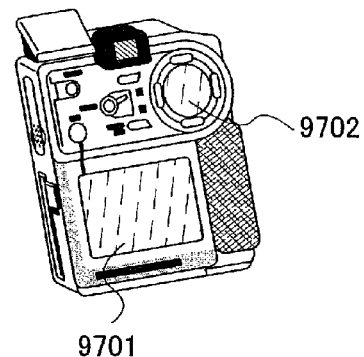

A digital video camera shown in FIG. 6B includes a display portion 9701, a display portion 9702 and the like. The light-emitting device of the present invention can be applied to the display portions 9701 and 9702. As a result, the digital video camera whose contrast is excellent and which does not need a polarizing plate or the like can be provided.

Figure 6C:
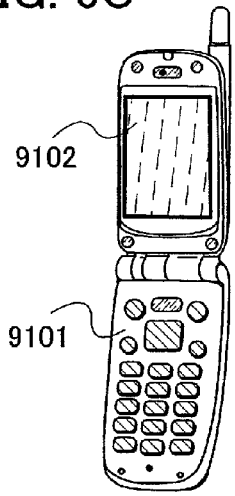

A cellular phone shown in FIG. 6C includes a main body 9101, a display portion 9102 and the like. The light-emitting device of the present invention can be applied to the display portion 9102. As a result, the cellular phone whose contrast is excellent and which does not need a polarizing plate or the like can be provided.

Figure 6D:
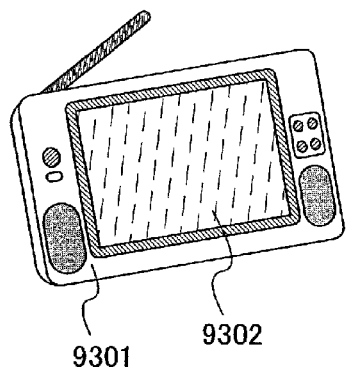

A portable television set shown in FIG. 6D includes a main body 9301, a display portion 9302 and the like. The light-emitting device of the present invention can be applied to the display portion 9302. As a result, the portable television set whose contrast is excellent and which does not need a polarizing plate or the like can be provided. The light-emitting device of the present invention can be widely applied to various types of portable television sets such as a small-sized television incorporated in a portable terminal such as a cellular phone, and a medium-sized television which is portable.

Figure 6E:
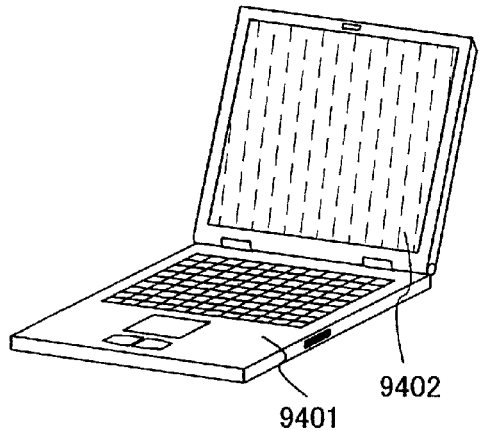

A portable computer shown in FIG. 6E includes a main body 9401, a display portion 9402 and the like. The light-emitting device of the present invention can be applied to the display portion 9402. As a result, the portable computer whose contrast is excellent and which does not need a polarizing plate or the like can be provided.

Figure 6F:
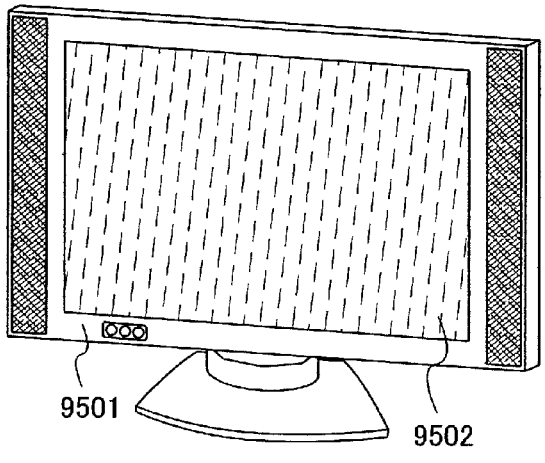

A television set shown in FIG. 6F includes a main body 9501, a display portion 9502 and the like. The light-emitting device of the present invention can be applied to the display portion 9502. As a result, the television set whose contrast is excellent and which does not need a polarizing plate or the like can be provided.

As described above, by using a light-emitting device according to the present invention, electronic devices whose contrast is excellent and which does not need a polarizing plate or the like can be provided.

Example 1

Example 1 will describe transmittance of a light-absorbing layer of the present invention.

A glass substrate was fixed to a substrate holder provided in a vacuum evaporation apparatus and then the pressure was reduced to about $10^{-4}$ Pa. Next, 4,4'-bis[N-(1-naphthyl)-N-phenylamino]biphenyl (abbreviation: NPB) and molybdenum(VI) oxide were co-deposited, whereby a layer including an organic compound and a metal oxide was formed. The thickness of the layer was set to be 200 nm and the weight ratio of NPB to molybdenum(VI) oxide was set to be 1:1 (=NPB:molybdenum oxide). Note that the co-evaporation method is an evaporation method in which evaporation is performed using a plurality of evaporation sources at the same time in one treatment chamber.

Fluorine ions are implanted into the layer including an organic compound and a metal oxide by an ion implantation method. The acceleration voltage was 35 keV and the concentration of implanted fluorine ions was $1.0 \times 10^{16}$ atoms/cm$^2$.

Transmittances of light of the thus formed sample after and before implantation of fluorine ions were measured. As a result, the transmittance after the implantation was 39, when the average of the transmittance of the sample with respect to light with a wavelength of 400 nm to 700 nm before the implantation of the fluorine ions was considered to be 100. Therefore, by adding a halogen atom into the layer including an organic compound and a metal oxide, it is found that transmittance of visible light can be reduced and the layer can be used as a light-absorbing layer.

This application is based on Japanese Patent Application Serial No. 2007-157434 filed with Japan Patent Office on Jun. 14, 2007, the entire contents of which are hereby incorporated by reference.

What is claimed is:

1. A light-emitting device comprising:
   a substrate;
   a first electrode over the substrate, the first electrode being a non-light-transmitting electrode;
   a light-absorbing layer over the first electrode, the light-absorbing layer comprising metal oxide, organic compound, and halogen;
   a light-emitting layer over the light-absorbing layer; and
   a second electrode over the light-emitting layer, the second electrode being a light-transmitting electrode,
   wherein the light-absorbing layer absorbs light in a visible region, and
   wherein a concentration of the halogen included in the light-absorbing layer is $1 \times 10^{21}$ atoms/cm$^3$ or higher.

2. The light-emitting device according to claim 1, wherein the first electrode is an anode and the second electrode is a cathode.

3. The light-emitting device according to claim 1, wherein the light-absorbing layer is in contact with the first electrode.

4. The light-emitting device according to claim 1, wherein the metal oxide is one selected from the group consisting of vanadium oxide, molybdenum oxide, niobium oxide, rhenium oxide, tungsten oxide, ruthenium oxide, titanium oxide, chromium oxide, zirconium oxide, hafnium oxide, and tantalum oxide.

5. The light-emitting device according to claim 1, wherein the organic compound is a hole-transporting material.

6. The light-emitting device according to claim 1, wherein the halogen is fluorine.

7. The light-emitting device according to claim 1, further comprising a thin film transistor over the substrate, electrically connected to the first electrode.

8. An electronic device comprising the light-emitting device according to claim 1.

9. A light-emitting device comprising:
a substrate;
a first electrode over the substrate, the first electrode being a light-transmitting electrode;
a light-emitting layer over the first electrode;
a light-absorbing layer over the light-emitting layer, the light-absorbing layer comprising metal oxide, organic compound, and halogen; and
a second electrode over the light-absorbing layer, the second electrode being a non-light-transmitting electrode,
wherein the light-absorbing layer absorbs light in a visible region, and
wherein a concentration of the halogen included in the light-absorbing layer is $1 \times 10^{21}$ atoms/cm$^3$ or higher.

10. The light-emitting device according to claim 9, wherein the first electrode is a cathode and the second electrode is an anode.

11. The light-emitting device according to claim 9, wherein the light-absorbing layer is in contact with the second electrode.

12. The light-emitting device according to claim 9, wherein the metal oxide is one selected from the group consisting of vanadium oxide, molybdenum oxide, niobium oxide, rhenium oxide, tungsten oxide, ruthenium oxide, titanium oxide, chromium oxide, zirconium oxide, hafnium oxide, and tantalum oxide.

13. The light-emitting device according to claim 9, wherein the organic compound is a hole-transporting material.

14. The light-emitting device according to claim 9, wherein the halogen is fluorine.

15. The light-emitting device according to claim 9, further comprising a thin film transistor over the substrate, electrically connected to the first electrode.

16. An electronic device comprising the light-emitting device according to claim 9.

17. A light-emitting device comprising:
a substrate;
a thin film transistor over the substrate;
a first electrode being electrically connected to the thin film transistor, the first electrode being a non-light-transmitting electrode;
a light-absorbing layer over the first electrode, the light-absorbing layer comprising metal oxide, organic compound, and halogen;
a light-emitting layer over the light-absorbing layer; and
a second electrode over the light-emitting layer, the second electrode being a light-transmitting electrode,
wherein the light-absorbing layer extends over a region in which the thin film transistor is formed, and
wherein the light-absorbing layer absorbs light in a visible region, and
wherein a concentration of the halogen included in the light-absorbing layer is $1 \times 10^{21}$ atoms/cm$^3$ or higher.

18. The light-emitting device according to claim 17, wherein the first electrode is an anode and the second electrode is a cathode.

19. The light-emitting device according to claim 17, wherein the light-absorbing layer is in contact with the first electrode.

20. The light-emitting device according to claim 17, wherein the metal oxide is one selected from the group consisting of vanadium oxide, molybdenum oxide, niobium oxide, rhenium oxide, tungsten oxide, ruthenium oxide, titanium oxide, chromium oxide, zirconium oxide, hafnium oxide, and tantalum oxide.

21. The light-emitting device according to claim 17, wherein the organic compound is a hole-transporting material.

22. The light-emitting device according to claim 17, wherein the halogen is fluorine.

23. An electronic device comprising the light-emitting device according to claim 17.

* * * * *